US 9,580,796 B2

(12) United States Patent
Ritchie et al.

(10) Patent No.: US 9,580,796 B2
(45) Date of Patent: Feb. 28, 2017

(54) DEPOSITION APPARATUS AND METHODS TO REDUCE DEPOSITION ASYMMETRY

(75) Inventors: Alan Ritchie, Menlo Park, CA (US); Michael S. Cox, Gilroy, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/173,197

(22) Filed: Jun. 30, 2011

(65) Prior Publication Data

US 2012/0000772 A1    Jan. 5, 2012

Related U.S. Application Data

(60) Provisional application No. 61/361,107, filed on Jul. 2, 2010.

(51) Int. Cl.
| | |
|---|---|
| C23C 14/00 | (2006.01) |
| C23C 14/35 | (2006.01) |
| C23C 16/517 | (2006.01) |
| H01J 37/32 | (2006.01) |
| H01J 37/34 | (2006.01) |

(52) U.S. Cl.
CPC ............ *C23C 14/35* (2013.01); *C23C 16/517* (2013.01); *H01J 37/32651* (2013.01); *H01J 37/34* (2013.01); *H01J 37/3411* (2013.01); *H01J 37/3455* (2013.01)

(58) Field of Classification Search
CPC .................................................. H01J 37/3411
See application file for complete search history.

(56) References Cited

U.S. PATENT DOCUMENTS

| | | | | |
|---|---|---|---|---|
| 3,749,662 | A * | 7/1973 | Biehl ....................... | 204/298.09 |
| 5,571,576 | A * | 11/1996 | Qian et al. .................... | 427/574 |
| 5,879,523 | A | 3/1999 | Wang et al. | |
| 5,891,349 | A | 4/1999 | Tobe et al. | |
| 6,790,326 | B2 | 9/2004 | Subramani et al. | |
| 6,896,775 | B2 | 5/2005 | Chistyakov | |
| 6,905,578 | B1 * | 6/2005 | Moslehi et al. ......... | 204/192.12 |
| 7,399,943 | B2 * | 7/2008 | Brown et al. ............ | 219/121.43 |
| 2002/0162737 | A1 | 11/2002 | Durs | |
| 2006/0260938 | A1 * | 11/2006 | Petrach ................. | C23C 14/568 |
| | | | | 204/298.16 |
| 2006/0272935 | A1 | 12/2006 | Le et al. | |
| 2007/0125646 | A1 * | 6/2007 | Young et al. ............ | 204/298.12 |
| 2007/0158179 | A1 * | 7/2007 | Ciancio et al. ............ | 204/192.1 |

(Continued)

FOREIGN PATENT DOCUMENTS

| | | |
|---|---|---|
| JP | S57-060073 | 4/1982 |
| JP | H02-110733 | 4/1990 |

(Continued)

OTHER PUBLICATIONS

PCT International Search Report & Written Opinion in PCT/US2011/042619, dated Feb. 24, 2012, 11 pgs.

*Primary Examiner* — Keith Hendricks
*Assistant Examiner* — Timon Wanga
(74) *Attorney, Agent, or Firm* — Servilla Whitney LLC

(57) ABSTRACT

One or more embodiments of the invention are directed to deposition apparatuses comprising a grounded top wall, a processing chamber and a plasma source assembly having a conductive hollow cylinder and substantially continuous grounded shield substantially conforming to the shape of the hollow cylinder.

7 Claims, 7 Drawing Sheets

(56) References Cited

U.S. PATENT DOCUMENTS

| | | | |
|---|---|---|---|
| 2007/0295602 A1* | 12/2007 | Tiller et al. | 204/298.11 |
| 2008/0023318 A1 | 1/2008 | Kuroiwa | |
| 2008/0178801 A1 | 7/2008 | Pavloff et al. | |
| 2008/0289957 A1 | 11/2008 | Takigawa et al. | |
| 2010/0096261 A1* | 4/2010 | Hoffman et al. | 204/298.08 |

FOREIGN PATENT DOCUMENTS

| | | |
|---|---|---|
| JP | H04-069465 | 3/1992 |
| JP | H04-247878 | 9/1992 |
| JP | H05-315268 | 11/1993 |
| JP | H06-112166 | 4/1994 |
| JP | H10-074733 | 3/1998 |
| JP | 2002-356772 | 12/2002 |
| JP | 2002-363740 | 12/2002 |
| JP | 2003-017414 | 1/2003 |
| JP | 2004-526051 | 8/2004 |
| JP | 2006-505128 | 2/2006 |
| JP | 2006-083408 | 3/2006 |
| JP | 2007-250860 | 9/2007 |
| JP | 2008-028046 | 2/2008 |
| JP | 2008-066240 | 3/2008 |
| JP | 2008-261047 | 10/2008 |
| KR | 10-2001-0089674 | 10/2001 |
| TW | 200428428 | 12/2004 |
| WO | WO-00/38213 | 6/2000 |

* cited by examiner

DEPOSITION APPARATUS AND METHODS TO REDUCE DEPOSITION ASYMMETRY

CROSS-REFERENCE TO RELATED APPLICATIONS

This application claims priority under 35 U.S.C. 119(e) to U.S. Provisional Patent Application No. 61/361,107, filed Jul. 2, 2010.

BACKGROUND

Embodiments of the invention generally relate to deposition apparatus and methods of use. More specifically, embodiments of the invention relate to deposition apparatus which include a continuous grounded shield positioned outside a plasma source assembly.

Various deposition processes, including physical vapor deposition (PVD) and chemical vapor deposition (CVD) are used to deposit metal films such as copper onto semiconductor wafers to form electrical interconnections. In some PVD processes, a high level of D.C. power is applied to a copper target overlying the wafer in the presence of a carrier gas, such as argon. PVD processes typically rely upon a very narrow angular distribution of ion velocity to deposit metal onto sidewalls and floors of high aspect ratio openings in the wafer. The deposition of sufficient material on the sidewalls relative to the amount deposited on the floors of the openings presents a problem. Another problem pertains to avoiding pinch-off of the opening due to faster deposition near the top edge of the opening. As miniaturization of feature sizes has progressed, the aspect ratio (depth/width) of a typical opening has increased, with microelectronic feature sizes having now been reduced to about 22 nanometers. With greater miniaturization, it has become more difficult to achieve minimum deposition thickness on the sidewall for a given deposition thickness on the floor or bottom of each opening.

The increased aspect ratio of the typical opening has been addressed by further narrowing of the ion velocity angular distribution, by increasing the wafer-to-sputter target distance (e.g., to 300 mm or more) and reducing the chamber pressure (e.g., to less than 1 mT). This has given rise to a problem observed in thin film features near the edge of the wafer: At extremely small feature sizes, a portion of each high aspect ratio opening sidewall is shadowed from a major portion of the target because of the greater wafer-to-target gap required to meet the decreasing feature size. This shadowing effect, most pronounced near the wafer edge, makes it difficult if not impossible to reach a minimum deposition thickness on the shadowed portion of the side wall. With further miniaturization, it has seemed a further decrease and chamber pressure (e.g., below 1 mT) and a further increase in wafer-sputter target gap would be required, which would exacerbate the foregoing problems.

Current RF and VHF capacitive source designs utilize asymmetric feed designs. It has been seen that asymmetry of the feed design leads to asymmetry of the electric field at the target surface. This asymmetry at the target or powered electrode invariably results in asymmetry of the deposition or etching of the wafer. Controlling aspect ratios of the feed design is insufficient to negate the asymmetry. The asymmetry, also referred to as "skew", can become a controlling factor. Therefore, to achieve acceptable nonuniformities the skew must be mitigated.

SUMMARY

One or more embodiments of the invention are directed to a deposition apparatus bounded by a grounded side wall and a grounded top wall. The apparatus comprises a processing chamber, a plasma source assembly and a grounded shield. The processing chamber is bounded by the grounded side wall and has a ceiling and a floor. The plasma source assembly is on the ceiling of the processing chamber and comprises a conductive hollow cylinder and at least one power source connected to the conductive hollow cylinder. A substantially continuous grounded shield is outside the conductive hollow cylinder and in contact with one or more of the grounded side wall and the grounded top wall of the deposition apparatus. The substantially continuous grounded shield substantially conforms in shape with the conductive hollow cylinder so that a space between the conductive hollow cylinder and the grounded shield is substantially uniform.

Some embodiments further comprise at least one power source connected to the conductive hollow cylinder through a connection rod which does not pass through the grounded shield. In specific embodiments, the ground shield acts as a coaxial transmission line to create a symmetrical electric field.

In detailed embodiments, the at least one power source is connected to conductive hollow cylinder through an opening in the grounded top wall and connects to the conductive hollow cylinder off axis an RF power source connected to the hollow cylinder and a DC power source connected to the hollow cylinder. In one or more embodiments, the at least one power source comprises an RF power source and a DC power source connected to opposite sides of the conductive hollow cylinder.

In various embodiments, the deposition apparatus is a physical vapor deposition chamber or a chemical vapor deposition chamber.

In some embodiments, the continuous grounded shield is integrally formed with the grounded side wall and the grounded top wall of the apparatus.

In detailed embodiments, the processing chamber has a processing region defined by a pedestal, a sputter target and a cylindrical skirt. The pedestal is positioned adjacent the floor of the processing chamber. The sputter target is positioned adjacent the ceiling of the processing chamber. The cylindrical skirt has a radius that encompasses the sputter target and the pedestal.

In specific embodiments, the continuous grounded shield is made from a material selected from the group consisting of non-magnetic conductors, aluminum, copper, nickel plated materials, silver plated materials and combinations thereof.

According to some embodiments, the plasma source assembly further comprises a magnet assembly supported on a radial arm and an axial spindle supporting the radial arm, the axial spindle extending through an opening in the hollow cylinder. In detailed embodiments, the axial spindle is connected to an actuator which is adapted to rotate the axial spindle along an axis causing the magnet supported on the radial arm to be rotated about the axial spindle over the ceiling of the processing chamber. In specific embodiments, the axial spindle is made from a dielectric material having a dielectric constant less than about 10.

One or more embodiments have the conductive hollow cylinder and the continuous grounded shield separated by a space. In detailed embodiments, the space is filled with a dielectric material.

In specific embodiments, an electric field generated by the RF power source and DC power source has a more uniform distribution across a sputter target than an electric field generated in a similar chamber without the substantially continuous grounded shield.

Some embodiments of the apparatus further comprises a process gas source connected to a gas distribution ring in the chamber through a mass flow controller.

The pedestal of detailed embodiments further comprises an internal electrode. In specific embodiments, the apparatus further comprising a controllable DC voltage source connected to the internal electrode of the pedestal. Some embodiments having an apparatus further comprise a low frequency RF bias power generator connected through an RF impedance match to the internal electrode of the pedestal.

The sputter target of detailed embodiments is selected from the group consisting of silicon, doped silicon, zinc oxide, indium tin oxide, transparent conductive oxide, metals, copper indium gallium diselenide (CIGS) and combinations thereof.

Additional embodiments of the invention are directed to deposition apparatus bounded by a grounded side wall and a grounded bottom wall. The apparatus comprises a processing chamber and a substantially continuous grounded shield. The processing chamber is bounded by the grounded side wall and grounded bottom wall and has a processing region defined as the space above a conductive pedestal positioned adjacent the grounded bottom wall. The substantially continuous grounded shield is positioned outside the pedestal and is in contact with one or more of the grounded side wall and the grounded bottom wall of the deposition apparatus. The substantially continuous grounded shield substantially conforms in shape with the conductive pedestal so that a space between the conductive pedestal and the grounded shield is substantially uniform.

In some embodiments, there is at least one power source is connected to the conductive pedestal through a connection rod which does not pass through the continuous grounded shield.

The continuous grounded shield of one or more embodiments acts as a coaxial transmission line to create a symmetrical electric field. The continuous grounded shield in some embodiments is integrally formed with the grounded side wall and grounded bottom wall.

In detailed embodiments, the electric field generated by an RF power source has a more uniform distribution across the pedestal than an electric field generated in a similar apparatus without the substantially continuous grounded shield.

The pedestal of specific embodiments further comprises an internal electrode. A controllable DC voltage source may be connected to the internal electrode of the pedestal. A low frequency RF bias power generator may be connected through an RF impedance match to the internal electrode of the pedestal.

BRIEF DESCRIPTION OF THE DRAWINGS

So that the manner in which the exemplary embodiments of the present invention are attained and can be understood in detail, a more particular description of the invention, briefly summarized above, may be had by reference to the embodiments thereof which are illustrated in the appended drawings. It is to be appreciated that certain well known processes are not discussed herein in order to not obscure the invention.

Figure 1:
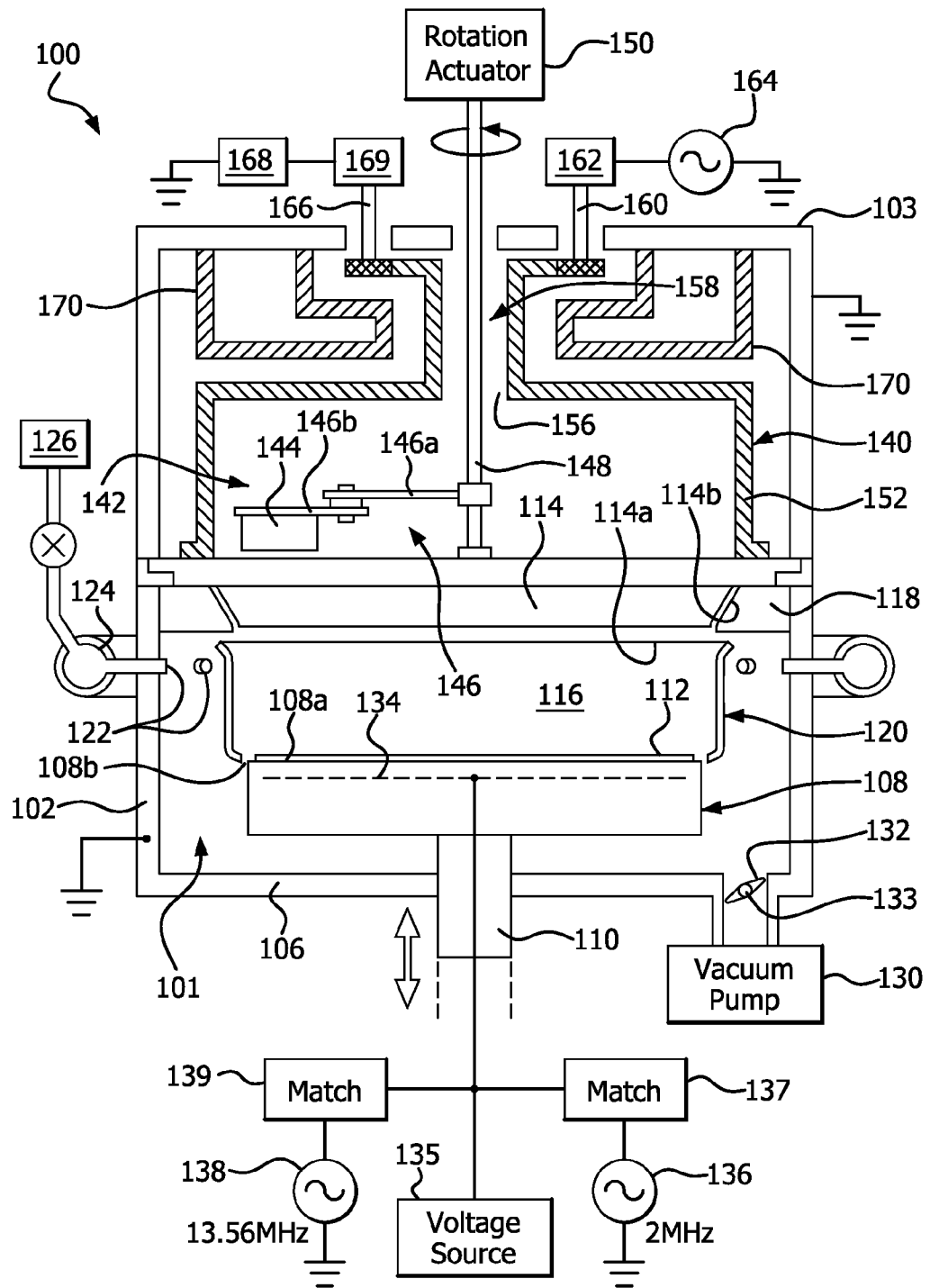
FIG. 1 shows a simplified elevational view of a physical vapor deposition apparatus in accordance with one or more embodiments of the invention.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

As used in this specification and the appended claims, the singular forms "a", "an" and "the" include plural referents unless the context clearly indicates otherwise. For example, reference to a "cell" may also refer to more than one cell, and the like.

As used in this specification and the appended claims, the terms "VHF" and "RF" are used interchangeably. In common usage, the term "RF" is used to describe frequencies less than about 30 MHz and the term "VHF" is used to describe frequencies greater than about 30 MHz. It should be understood that the various embodiments of the invention are not limited to either VHF or RF frequencies and this should not be taken as limiting the scope of the embodiments. It has been observed that higher frequency results in higher plasma density. As the frequency increases above about 27 MHz there is a dramatic increase in plasma asymmetry. As higher frequencies are often desired, the field asymmetry becomes a greater issue.

Embodiments of the invention help mitigate the nonuniformity of asymmetric RF/VHF designs. It has been seen that the deposition "skew" could be reduced to negligible levels when a ground plane was placed around the feed. Without being bound by any particular theory of operation, it is believed that the ground plane screens the electric field and modifies the current distribution. The impedance of the source changed significantly from a highly inductive reactance to a lower inductive reactance. The additional ground plane can extend down and around the RF feed, forming a coax style delivery system, resulting in a dramatically reduced skew.

It has been found that reduced wafer-target gaps in PVD render the processes vulnerable to asymmetries in the distribution of RF power to the target. In particular, the RF power must be applied to an overhead structure (e.g., the ceiling) above the sputter target at an off-axis connection because the center axis is occupied by the magnetron rotation apparatus. Each time the rotating magnet of the magnetron assembly passes under the off-axis RF power connection, RF coupling to the plasma is briefly enhanced, while plasma conditions (e.g., plasma load impedance presented to the VHF power) are changed. D.C. power, which may be connected at another off-axis location above the target, is affected by these changes. These fluctuations occur with each rotation of the magnet past the off-axis RF power connection. While such fluctuations have not been a problem in conventional reactors having large wafer-to-target gaps (e.g., 300 mm), with very small wafer-target gaps (e.g., 5 cm) such fluctuations are closely coupled to the wafer.

One symptom of the foregoing is an azimuthal pattern of non-uniform deposition on the wafer surface that reflects the off-axis locations of the RF power and DC power connections over the target. In one example, the deviation between minimum and maximum deposition film thickness in the azimuthal direction was 26%. Another symptom is plasma instability or fluctuations in plasma impedance that the VHF impedance match cannot follow at higher chamber pressures, leading to a loss of process control and in some cases automatic shut-down of the VHF generator. Another symptom is penetration of the plasma beneath the wafer support pedestal and damage to unprotected components there, leading to contamination. The impedance fluctuations reduce the range of usable chamber pressures below the desired pressure. A related problem is that if the DC power level is reduced, the fluctuations in plasma conditions caused by passage of the magnet beneath the RF connection over the target (e.g., sudden reductions in voltage) cause automatic anti-arcing features in the DC power source to shut down the DC power source. A similar effect can occur with the VHF generator, so that either or both the DC power and the RF power may flicker with each rotation of the magnet. These problems have made it difficult to perform a workable process at high chamber pressures (e.g., 100 mT).

A non-magnetic metallic housing covers the space within which the magnet circulates above the chamber ceiling. The magnet rotation drive shaft extends through a central passage in the ceiling of this conductive housing. A conductive hollow cylinder surrounding the shaft extends upwardly from the conductive housing ceiling coaxially with the magnet rotation drive shaft. The VHF impedance match (for the VHF generator) has its output coupled to the side of the hollow cylinder. The DC power source is also coupled to the side of the hollow cylinder cup. The DC and RF connections may be offset around the conductive hollow cylinder by about 180°.

The conductive hollow cylinder and the conductive housing surrounding the magnet circulation space are both conductors of the VHF source power applied to the target. RF shielding is provided by an outer conductive shield surrounding the conductive housing. The shield is grounded and is separated from the housing by an insulating space, which may be air or (alternatively) may be filled with an insulating material such as plastic. If the insulating space is mainly filled with air, then the separation may be maintained by placing small plastic spacers at periodic intervals along the space. Power loss due to parasitic capacitance is minimized by providing a material in the insulating space having a low dielectric constant (such as air). Parasitic capacitance is further minimized by providing a large separation distance between the shield and the housing. In one embodiment, the parasitic capacitance presented by the shield was about 14 picofarads, presenting an impedance to ground of about 0.2Ω at 60 MHz.

In order to avoid arcing or breakdown of the insulating material, the separation distance is sufficiently large so that the electric field across the insulating space attributable to the voltage on the ceiling does not exceed the electrical breakdown threshold of the insulating material. If the housing-shield separation space is filled with air, then the separation distance is sufficiently great to limit the electric field to 30,000 volts/cm (the breakdown threshold of air). The voltage on the ceiling may, in one example, be about 1100 volts, attributable to about 500 volts VHF from the RF source, about 500 volts DC from the DC source and about 100 volts RF from a bias voltage applied to the wafer and returned through the ceiling. In this example, the separation distance would need to be at least about 0.3 mm.

FIG. 1 illustrates a physical vapor deposition (PVD) apparatus, also called a processing chamber 100, according to one or more embodiments of the invention. While a physical vapor deposition chamber is shown, it should be understood, and it is shown in later figures, that the apparatus could be a chemical vapor deposition chamber. The chamber 100 shown is suitable for carrying out plasma-enhanced physical vapor deposition on a workpiece such as a semiconductor wafer. The PVD apparatus, or processing chamber 100, shown has a cylindrical grounded side wall 102 and a grounded top wall 103. A processing chamber 100, or vacuum chamber, is enclosed by a cylindrical side wall 102, a ceiling 104 and a bottom wall 106. A workpiece support pedestal 108 within the processing chamber 100 is held on a lift assembly or pedestal base 110 within the processing chamber 100 and has a workpiece support surface 108a facing the ceiling 104. A workpiece such as a semiconductor wafer 112 may be held on the support surface 108a. A sputter target 114 is held at the interior surface of the ceiling 104 and has a main surface 114a facing the support surface 108a of the pedestal 108. A process region 116 is defined between the support surface 108a and the target main surface 114a. An annular ceramic spacer 118 surrounds a side edge 114b of the sputter target 114. An annular confinement skirt 120 surrounding the process region 116 extends axially from the ceramic spacer 118 to the top peripheral edge 108b of the support pedestal 108. Gas injection nozzles 122 extending through the sidewall 102 at spaced-apart locations are coupled to a hollow gas distribution ring 124. A process gas source 126 furnishes a process gas to the gas distribution ring 124 through a mass flow controller or valve 128. A vacuum pump 130 is coupled to the chamber 100 through a passage 132 through the bottom wall 106. A vacuum control valve 133 controls the chamber pressure. In specific embodiments, the target 114 is selected from the group consisting of silicon, doped silicon, zinc oxide, indium tin oxide, transparent conductive oxide, metals, copper indium gallium diselenide (CIGS) and combinations thereof.

The wafer support pedestal 108 may include an internal electrode 134. If the pedestal 108 embodies an electrostatic chuck, then a controllable D.C. voltage source 135 may be connected to the pedestal internal electrode 134. In order to control ion energy at the surface of the wafer 112, a low frequency RF bias power generator 136 may be connected through an RF impedance match 137 to the electrode 134. In addition, an intermediate or high frequency RF bias power generator 138 may be connected through an impedance match 139 to the electrode 134.

A plasma source assembly 142 overlying the ceiling 104 contains a conductive hollow cylinder 140. The plasma source assembly 142 shown includes a magnet 144 supported on a radial arm 146 and an axial spindle 148 supporting the arm 146. The radial arm 146 has separately articulating arm sections 146a, 146b. A rotation actuator 150 rotates the spindle 148, causing the magnet 144 to perform an orbital rotational motion over the ceiling 104. The conductive hollow cylinder 140 includes an enclosure side wall 152 and an housing lid 154. The lid has a central circular opening 156 through which the spindle 148 extends between the radial arm 146 and the rotation actuator 150 external of the conductive hollow cylinder 140. In detailed embodiments, the axial spindle 148 is made of a dielectric material. In specific embodiments, the dielectric constant of the material is less than about 10. In various embodiments, the dielectric constant is less than about 9, 8, 7, 6, 5, 4, 3 or 2. In some embodiments, the dielectric constant is less than about 8. In one or more embodiments, the dielectric constant is about 4.

The problem of plasma fluctuations arises upon application of RF source power to the target 114 by coupling the source power to an off-axis point on the chamber ceiling 104 or an off-axis point on the housing lid 154 (as two possible examples). The RF power distribution is necessarily concentrated at the point of application, leading to an azimuthally non-uniform RF power distribution. As the magnet 144 passes through a point of rotation in alignment with the point of RF power application, power coupling to the plasma temporarily peaks, leading to the process fluctuations discussed earlier in this specification.

In order to avoid such an asymmetrical distribution of RF power, an RF Feed system includes a symmetrical conductor concentric with the axis of symmetry provided on top of the conductive hollow cylinder 140, for application of RF and DC power to the target 114. Specifically, a conductive hollow cylinder extension 158 surrounding the spindle 148 extends from the edge of the circular opening 156 away from the conductive hollow cylinder 140. An RF connection rod 160 extends radially outwardly from the hollow cylinder extension 158. An RF impedance match 162 is coupled to the outer end of the RF connection rod 160. An RF power generator 164 is coupled to the RF impedance match 162. A DC connection rod 166 extends radially outwardly from the hollow cylinder extension 158 in a direction opposite to that of the RF connection rod 160. A DC power source 168 is coupled to the outer end of the DC connection rod 166. The DC connection rod 166 may be connected to an RF blocking filter 169 of the DC power source 168.

A substantially continuous grounded shield 170 surrounds the RF feed system. As used in this specification and the appended claims, the term "substantially continuous" means that there are no openings in the shield of sufficient size to cause more than a 5% deviation in the symmetry of the electric field. More specifically, the continuous grounded shield 170 is located within the cylindrical walls 102 of the apparatus 100. The continuous grounded shield 170 is a circular component like the conductive hollow cylinder 140, with the Figures showing a cross-section.

Figure 2:
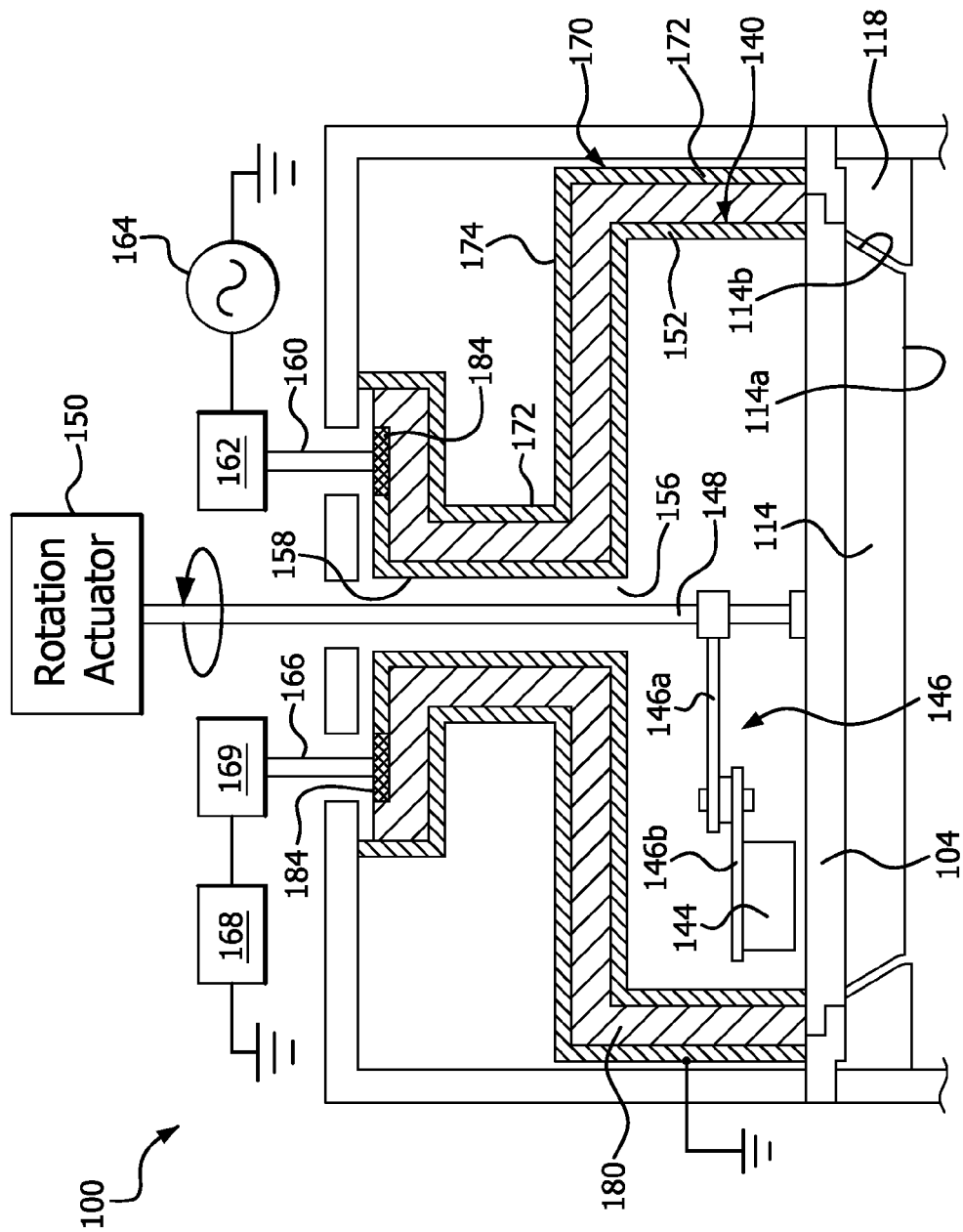
FIG. 2 shows an enlarged detailed view of one embodiments of the upper housing in the reactor of FIG. 1.
Figure 3:
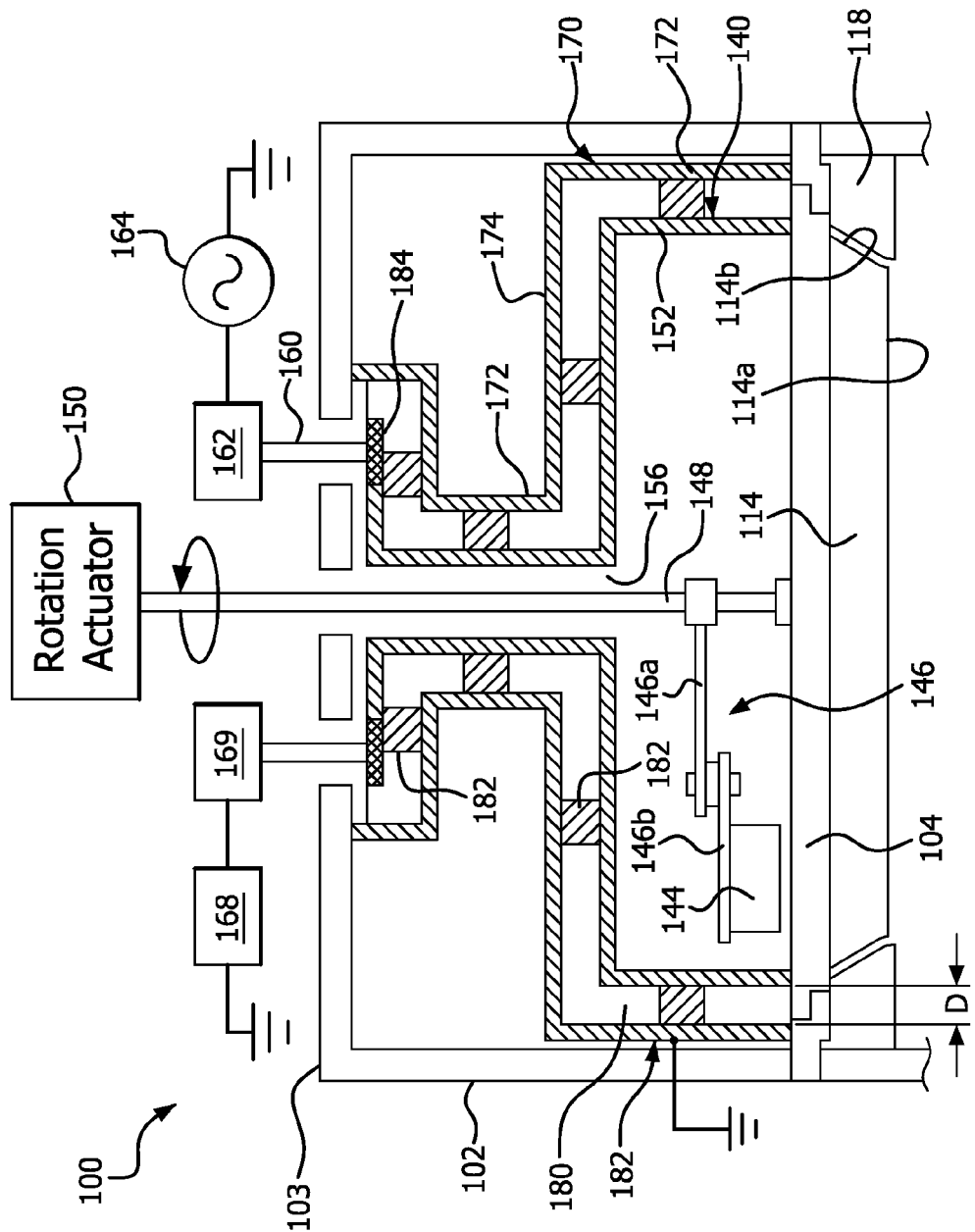
FIG. 3 shows an enlarged detailed view of one or more embodiments of the upper housing in the reactor of FIG. 1.
Figure 4:
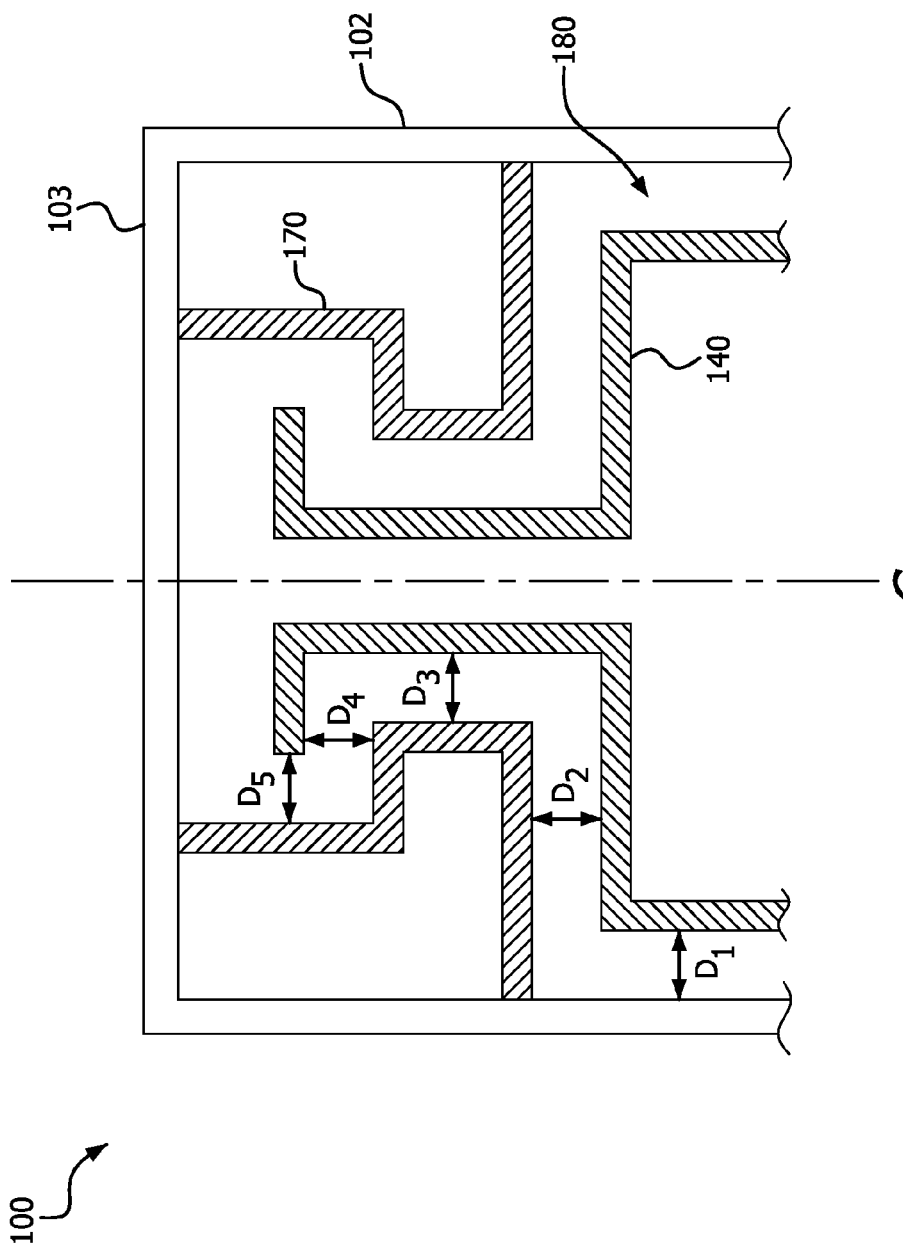
FIG. 4 shows an enlarged view a continuous grounded shield in accordance with one or more embodiments.

The continuous grounded shield 170 shown in FIGS. 1-3 have two ends connected to the grounded top wall 103. This is merely illustrative of one or more embodiments and should not be taken as limiting the shape of the continuous grounded shield 170. In some embodiments, as shown in FIG. 4, the continuous grounded shield 170 can be in contact with both the cylindrical side wall 102 and the grounded top wall 103.

The continuous grounded shield 170 substantially conforms in shape with at least the top portion of the conductive hollow cylinder 140 and can be seen to change directions with the conductive hollow cylinder 140. In specific embodiments, the continuous grounded shield 170 is made from a material selected from the group consisting of non-magnetic conductors, aluminum, copper, nickel plated materials, silver plated materials and combinations thereof. The continuous grounded shield 170 can be hollow or solid material. In specific embodiments, the continuous grounded shield 170 does not contact the hollow cylinder 140 but does conform to the shape of the conductive hollow cylinder 140. In detailed embodiments, the substantially continuous grounded shield 170 substantially conforms in shape with the conductive hollow cylinder 140 and forms a space 180 between the continuous grounded shield 170 and the conductive hollow cylinder 140 that is substantially uniform across the length of the space 180. As used in this specification and the appended claims, the term "substantially uniform" means that the space between the conductive hollow cylinder 140 and the continuous grounded shield 170 varies by an amount such that the impedance of the transmission line formed varies by less than about 25%. In various embodiments, "substantially uniform" means that the space varies by an amount such that the impedance of the transmission line formed varies by less than about 20%, 15%, 10% or 5%.

The thickness of the continuous grounded shield 170 can vary depending on the manufacturing process. High frequency power will not penetrate the full thickness of the material used in the continuous grounded shield 170 and will run on the surface to a certain depth (skin depth). As the frequency is increased the skin depth becomes shallower. In some embodiments, the continuous grounded shield 170 has a thickness greater than about the skin depth of the frequency used. In detailed embodiments, the continuous grounded shield 170 has a thickness greater than about twice the skin depth of the frequency used. In various embodiments, the thickness of the continuous grounded shield 170 is greater than about 3 times, 4 times or 5 times the skin depth of the frequency.

The hollow cylinder 158, the connection rods 160, 166, the conductive hollow cylinder 140 and the ceiling 104 are formed of a non-magnetic conductive material, such as aluminum for example. The connection rods 160, 166 pass through the grounded top wall 103 of the chamber 100 and connect to the conductive hollow cylinder 140 without passing through the continuous grounded shield 170. Therefore, no hole is needed in the continuous grounded shield 170 for this passage. The connection rods 160, 166 and the conductive hollow cylinder 140 may be formed of copper, to provide a highly conductive current path. RF current from the generator 164 flows in a circular manner around the hollow cylinder extension 158 for uniform distribution around the circumference of the conductive hollow cylinder 140 and uniform application to the target 114. DC current from the DC source 168 flows in a circular manner around the hollow cylinder extension 158 for uniform distribution around the circumference of the conductive hollow cylinder 140 and uniform application to the target 114. The target 114 is typically a metallic species that is to be deposited onto the workpiece or wafer 112.

Without being bound by any particular theory of operation, it is believed that the substantially continuous grounded shield 170 acts as a coaxial transmission line connecting the RF impedance match and the plasma load. As a transmission line it acts similarly to a waveguide, but with a center conductor, as in a coaxial cable. Thus, the grounded portion is the outer conductor (continuous grounded shield 170) and the inner conductor which carries the input power would be analogous to the center conductor of the transmission line. This construction maintains a Plane Wave mode between the inner conductor and the outer grounded shield, as called a Transverse Electromagnetic Mode, or TEM mode. In specific embodiments, the ground shield acts as a coaxial transmission line to create a symmetrical, or more symmetrical electric field.

An important property of this type of transmission line is that the only potential variation is along its length, but axially it is equipotential. This property ensures that the potential, or voltage, of the wave delivered to the conductor in contact with the plasma is symmetric about its center, and ensures its uniformity or concentricity. Another important property of this construction is that it is broadband, with no cutoff frequency. In other words, the design is good for a very wide spectrum of frequencies from RF to microwave, with only appropriate changes to the spacing or dielectric.

In specific embodiments of the invention, the proper construction of a transmission line incorporates a consistent gap between the conductors, a consistent dielectric (or air, or vacuum) between the conductors, and that any discontinuities in the conductors be eliminated or minimized. In detailed embodiments, an electric field generated by the RF power source and DC power source has a more uniform distribution across a sputter target than an electric field generated in a similar apparatus without the substantially continuous grounded shield FIG. 2 is an enlarged view of an apparatus according to one or more embodiments of the invention. A conductive hollow cylinder 140 is surrounded by a continuous grounded shield 170 conformal in shape with the conductive hollow cylinder 140. The continuous grounded shield 170 includes at least one cylindrical side wall 172 and at least one annular top 174 having a circular opening 156 at the mouth of a conductive hollow cylinder extension 158. The continuous grounded shield 170 further includes a cylindrical side wall 172 that is coaxial with the hollow cylinder extension 158. The continuous grounded shield 170 may be formed of a non-magnetic metal such as aluminum or copper, for example. The first grounded shield 170 and the conductive hollow cylinder 140 are separated by an insulating space 180. The space 180 in some embodiments is filled with a dielectric material having a low dielectric constant. One example of a suitable material is plastic, such as G-10 plastic.

The embodiment shown in FIG. 2 has a first grounded shield 170 shaped substantially conforming to the shape of the conductive hollow cylinder 140. These pieces can be two surfaces of a single unit or can be separate pieces. FIG. 4 shows a different configuration in which the continuous grounded shield 170 connects to the cylindrical side wall 102 of the chamber 100. The proximity of the pieces of the continuous grounded shield 170 to the pieces of the hollow cylinder 140 are not limiting and can depend on a variety of factors. This is explained further below with respect to FIG. 4.

FIG. 3 depicts an embodiment in which the space 180 is primarily filled with air, and is maintained by a number of small spacers 182. The spacers 182 may be formed of a dielectric material such as G-10 plastic. Parasitic capacitance is minimized by minimizing the dielectric constant of the space 180. For example, the spacers 182 may occupy a very small percentage of the volume of the space 180, the remainder of the space 180 being filled with a substance of minimum dielectric constant, such as air. Parasitic capacitance is further minimized by increasing the gap distance D across the space 180. In one embodiment, the connections rods 160, 166 may pass through respective openings 184 in the cylindrical sheath 178 of the first grounded shield 170. Annular insulator rings 186 may be inserted in the openings 184 to provide insulation between each rod 160, 166 and the edge of each respective opening 184.

The gap distance D of the space 180 is sufficiently large so that the electric field across the gap does not exceed the breakdown threshold of the dielectric material (e.g., air or plastic) of the space 180. For example, there may be a voltage difference of 1100 to 1200 volts across the gap D of the insulating space 180. This may occur if the RF generator 164 imposes an average RF voltage of about 500 volts on the housing 140, the DC source 168 imposes a DC voltage of about 500 volts on the housing 140 and the RF bias power return through the housing 140 may impose an additional 100 volts. In this case, if the space 180 is filled with air (breakdown threshold of 33,000 volts/cm) then the gap distance D of specific embodiments would have a minimum of about 0.3 mm.

Figure 5:
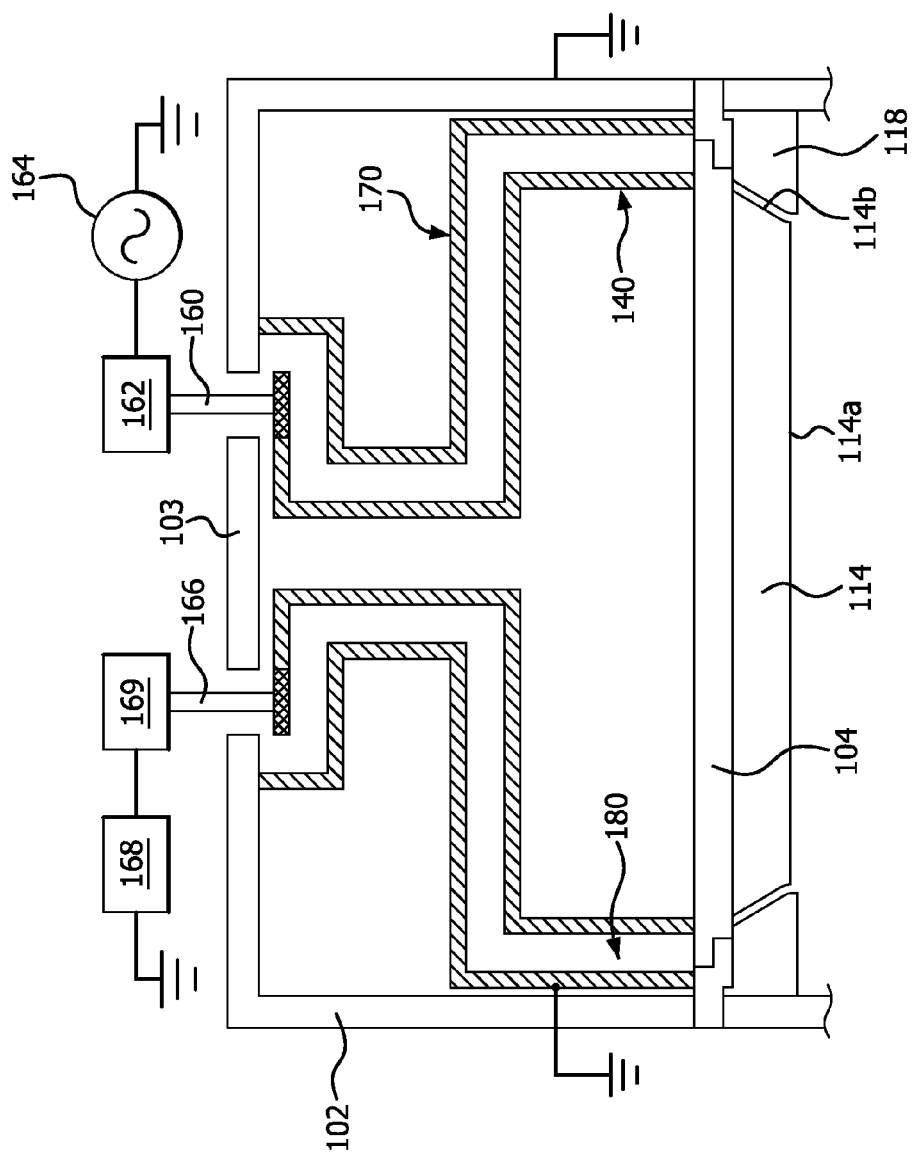
FIG. 5 shows a deposition apparatus in accordance with one or more embodiments.

FIG. 4 shows an expanded view of one or more embodiments showing a continuous grounded shield 170. The distance or space 180 between the conductive hollow cylinder 140 and the continuous grounded shield 170 is depicted at various locations as dimensions D1, D2, D3, D4 and D5. In some embodiments, the dimensions D1-D5 are different. In specific embodiments, the dimensions D1 through D5 are substantially the same, meaning that there is less than about a 10% absolute difference between the dimensions. While FIG. 4 shows a shape having five dimensions, this is merely illustrative and should not be taken as limiting the scope of the invention. In specific embodiments, where the space 180 is filled with air, the dimension D1, or its equivalent, is in the range of about 5 mm to about 25 mm. The dimensions can be modified as needed and may be tuned based on the plasma load and frequency. FIG. 5 shows an embodiment of a deposition chamber similar to that of FIG. 2 or 3 but without the rotating magnet assembly.

Figure 6:
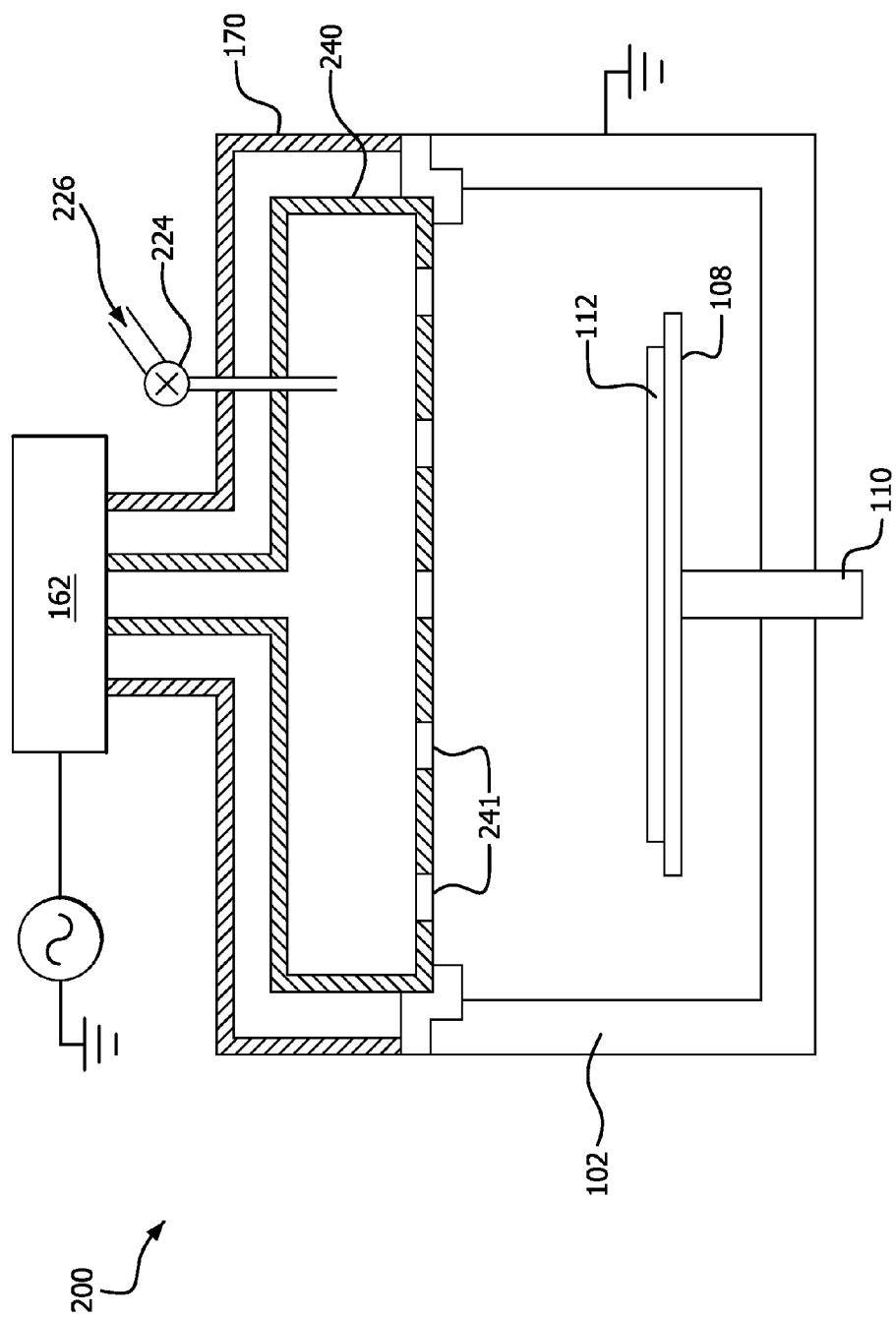
FIG. 6 shows a chemical vapor deposition apparatus in accordance with one more embodiments of the invention.

FIG. 6 shows an embodiment of a chemical vapor deposition apparatus 200 in accordance with one or more embodiments of the invention. The apparatus 200 includes similar components to those previously described with the conductive hollow cylinder replaced with a conductive hollow cylinder 240 having a series of holes 241 spaced to allow a uniform flow of gas from the conductive hollow cylinder 240. It will be appreciated that FIG. 6 shows a cross-sectional view so that there are a plurality of holes 241 spaced throughout the conductive hollow cylinder 240. The holes 241 are small enough so as to not interfere with the conduction of power from the RF impedance match 162. A gas inlet 226 feeds a processing gas into the conductive hollow cylinder 240 and may include a metering device 224 for controlling the pressure of the processing gas in the apparatus 200. The gas inlet 226 is shown passing through the continuous grounded shield 170 but in specific embodiments, the gas inlet 226 does not pass through the shield so that no holes are formed in the shield.

Figure 7:
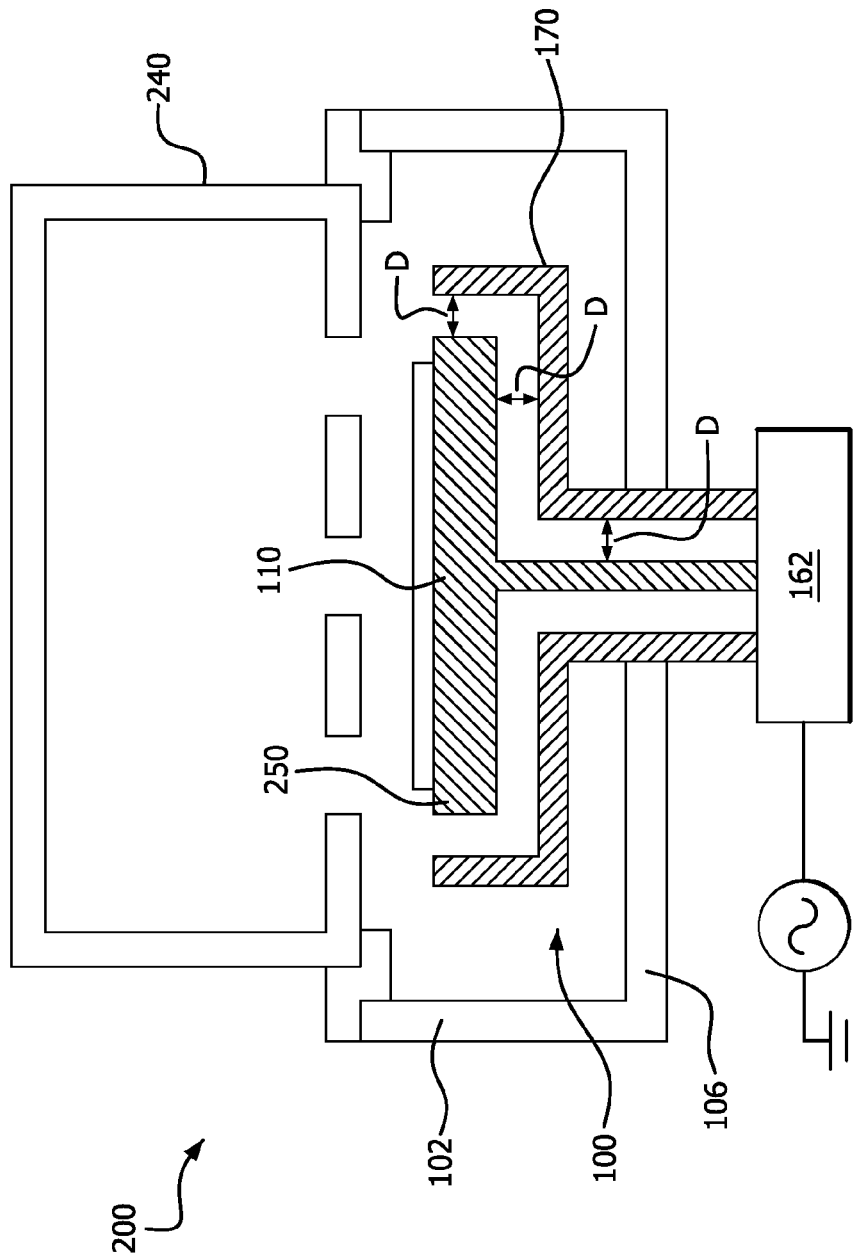
FIG. 7 shows a chemical vapor deposition apparatus in accordance with one or more embodiments of the invention.

FIG. 7 shows another apparatus 200 in accordance with various embodiments of the invention. The apparatus 200 shown in FIG. 7 is a CVD apparatus but can be a PVD apparatus like that of FIG. 1. The deposition apparatus 200 has a grounded side wall 102 and a grounded bottom wall 106. A processing chamber 100 is bounded by the grounded side wall 102 and the grounded bottom wall 106. The processing chamber 100 has a processing region defined as space above a conductive pedestal base 110. The conductive pedestal base 110 is positioned adjacent the grounded bottom wall 106 of the apparatus 200. An RF impedance match 162 is connected to the pedestal base 110, which in some embodiments has an internal electrode 134, as shown in FIG. 1. A substantially continuous grounded shield 170 is placed outside the pedestal base 110 (around the pedestal) and is shaped substantially conforming to the pedestal base 110 so that a space between the conductive pedestal and the grounded shield is substantially uniform. This configuration provides the same asymmetry benefits as the embodiments described with respect to FIGS. 1 through 6. In specific embodiments, both the pedestal base 110 and the conductive hollow cylinder 140 are surrounded by substantially continuous grounded shields 170. This results in greater electric symmetry in the apparatus.

In detailed embodiments, at least one power source is connected to the conductive pedestal through a connection rod which does not pass through the continuous grounded shield. The continuous grounded shield 170 of specific embodiments acts as a coaxial transmission line to create a symmetrical electric field and may be integrally formed with the grounded side wall and grounded bottom wall or separate components.

Reference throughout this specification to "one embodiment," "certain embodiments," "one or more embodiments," "an embodiment," "one aspect," "certain aspects," "one or more embodiments" and "an aspect" means that a particular feature, structure, material, or characteristic described in connection with the embodiment is included in at least one embodiment of the invention. Thus, the appearances of the phrases such as "in one or more embodiments," "in certain embodiments," "in one embodiment," "in an embodiment," "according to one or more aspects," "in an aspect," etc., in various places throughout this specification are not necessarily referring to the same embodiment or aspect of the invention. Furthermore, the particular features, structures, materials, or characteristics may be combined in any suitable manner in one or more embodiments or aspects. The order of description of the above method should not be considered limiting, and methods may use the described operations out of order or with omissions or additions.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

What is claimed is:

1. A deposition apparatus bounded by a grounded side wall and a grounded top wall, the apparatus comprising:
    a processing chamber bounded by the grounded side wall, the processing chamber having a ceiling and a floor, the processing chamber having a processing region defined by a pedestal and a cylindrical skirt;
    a plasma source assembly above the ceiling between the ceiling and the grounded top wall of the processing chamber, the plasma source assembly comprising a conductive hollow cylinder and at least one power source outside of and connected to the conductive hollow cylinder; and
    a substantially continuous grounded shield outside the processing chamber and around the conductive hollow cylinder and in contact with one or more of the grounded side wall or the grounded top wall of the deposition apparatus, the substantially continuous grounded shield substantially conforming in shape with the conductive hollow cylinder so that a space between the conductive hollow cylinder and the grounded shield is substantially uniform,
    wherein the power source is connected to the conductive hollow cylinder through a connection rod which does not pass through the continuous grounded shield.

2. The apparatus of claim 1, wherein the at least one power source is connected to the conductive hollow cylinder through an opening in the grounded top wall and connects to the conductive hollow cylinder off axis.

3. The apparatus of claim 1, wherein the continuous grounded shield is integrally formed with the grounded side wall and grounded top wall.

4. The apparatus of claim 1, wherein the at least one power source comprises an RF power source and a DC power source connected to opposite sides of the conductive hollow cylinder.

5. The apparatus of claim 1, wherein the continuous grounded shield is made from a material selected from the group consisting of non-magnetic conductors, aluminum, copper, nickel plated materials, silver plated materials and combinations thereof.

6. The apparatus of claim 1, wherein the space is filled with a dielectric material.

7. The apparatus of claim 1, further comprising a process gas source connected to a gas distribution ring in the chamber through a mass flow controller.

\* \* \* \* \*